(12) United States Patent
Liao

(10) Patent No.: US 7,446,547 B2
(45) Date of Patent: Nov. 4, 2008

(54) COOLING APPARATUS AND TESTING MACHINE USING THE SAME

(75) Inventor: Qing-Ming Liao, Guangdong (CN)

(73) Assignees: Hong Fu Jin Precision Industry (Shen Zhen) Co., Ltd., Longhua Town, Bao'an District, Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 197 days.

(21) Appl. No.: 11/308,737

(22) Filed: Apr. 27, 2006

(65) Prior Publication Data

US 2007/0052434 A1 Mar. 8, 2007

(30) Foreign Application Priority Data

Aug. 17, 2005 (CN) .................... 2005 1 0036735

(51) Int. Cl.
*G01R 31/02* (2006.01)
(52) U.S. Cl. .................................... 324/760
(58) Field of Classification Search ............. None
See application file for complete search history.

(56) References Cited

U.S. PATENT DOCUMENTS

| | | | | |
|---|---|---|---|---|
| 5,740,013 | A * | 4/1998 | Roesner et al. | 361/697 |
| 5,805,430 | A * | 9/1998 | Atwood et al. | 361/829 |
| 5,886,408 | A * | 3/1999 | Ohki et al. | 257/720 |
| 6,049,217 | A | 4/2000 | Viswanath | |
| 6,212,070 | B1 * | 4/2001 | Atwood et al. | 361/704 |
| 6,212,074 | B1 * | 4/2001 | Gonsalves et al. | 361/717 |
| 6,373,696 | B1 * | 4/2002 | Bolognia et al. | 361/687 |
| 6,418,024 | B2 * | 7/2002 | Edevold et al. | 361/707 |
| 6,501,658 | B2 * | 12/2002 | Pearson et al. | 361/709 |
| 6,509,754 | B2 | 1/2003 | Lin et al. | |
| 6,712,621 | B2 * | 3/2004 | Li et al. | 439/65 |
| 6,791,835 | B2 * | 9/2004 | Hashimoto et al. | 361/687 |
| 6,812,721 | B1 | 11/2004 | Cha | |
| 6,856,511 | B1 * | 2/2005 | Viernes et al. | 361/704 |
| 6,961,243 | B2 * | 11/2005 | Shih-Tsung | 361/700 |
| 7,262,969 | B2 * | 8/2007 | Lee et al. | 361/704 |
| 7,283,364 | B2 * | 10/2007 | Refai-Ahmed et al. | 361/719 |
| 7,385,818 | B2 * | 6/2008 | Heesen | 361/700 |
| 2002/0114137 | A1 * | 8/2002 | Pearson et al. | 361/709 |
| 2005/0152113 | A1 | 7/2005 | Pan | |
| 2005/0204747 | A1 * | 9/2005 | Atkinson | 62/3.7 |
| 2006/0114657 | A1 * | 6/2006 | Refai-Ahmed et al. | 361/719 |

FOREIGN PATENT DOCUMENTS

JP 04037094 A * 2/1992

* cited by examiner

*Primary Examiner*—Jermele M Hollington
(74) *Attorney, Agent, or Firm*—Winston Hsu

(57) ABSTRACT

A cooling apparatus includes a cooling device, a baseplate and at least one shock absorber. The cooling device is used for absorbing and dissipating heat. The shock absorber comprises a pole and a resilient member. The pole passes through the resilient member. The resilient member is clamped between the cooling device and the baseplate. The cooling device comprises a heatsink, and a fan such that the heatsink is supported by the fan. The heatsink defines a first guide hole therein. The fan defines a second guide hole therein. One end of the pole is connected to the baseplate, and the other end of the pole passes through the second guide hole of the fan and can slide within the first guide hole of the heatsink. A testing machine, using the cooling apparatus, for testing an electronic product is also disclosed.

9 Claims, 6 Drawing Sheets

COOLING APPARATUS AND TESTING MACHINE USING THE SAME

FIELD OF THE INVENTION

The present invention generally relates to a cooling apparatus and, more particularly, to a cooling apparatus configured to a testing machine for testing electronic products.

DESCRIPTION OF RELATED ART

Although electronic products is widely used in modern life, there is still a significant amount of complains regarding the quality standard of the electronic equipments. Hence, quality control and tests for electronic products have to play bigger roles during mass production.

Tests done by testing machines are applied on electronic products before they are distributed into the market. Take a mainboard of a computer for example, when the mainboard and some peripherals are connected together manually, a simulation test is started to find out whether all the peripherals work. Operators judge whether or not the mainboard functions properly based on the results of the simulation test. However, the simulation test that involves manual operation is very slow and consumes a lot of manpower. This limits mass producers in lowering production costs and increasing productivity. Moreover, if operators plug the peripherals to deviating predetermined positions, short-circuiting the product is liable to happen.

Thus, many testing machines are introduced to replace the manual operation. These testing machines generally comprise carriers, testing members, and a number of probes. In tests, the mainboard is set on the carrier, and then the probes are connected to the mainboard. After power is applied on the testing machine and the mainboard, the testing result is auto-generated by the testing member.

However, some heat-generating components on the mainboard generate so much heat that it may burn out the mainboard. Thus, the testing machine generally includes some cooling apparatuses to absorb and dissipate the heat. The mainboard is placed in the testing machine, with the heat-generating components in contact with the cooling apparatuses. However, fierce impact often occurs between the heat-generating components and the cooling apparatuses due to improper operation. The fierce impact is liable to damage the heat-generating components.

Therefore, a cooling apparatus is needed in the industry to address the aforementioned deficiencies and inadequacies.

SUMMARY OF THE INVENTION

A cooling apparatus includes a cooling device, a baseplate, and at least one shock absorber. The cooling device is used for absorbing and dissipating heat. The shock absorber comprises a pole and a resilient member. The pole passes through the resilient member. The resilient member is clamped between the cooling device and the baseplate. The cooling device comprises a heatsink, and a fan such that the heatsink is supported by the fan. The heatsink defines a first guide hole therein. The fan defines a second guide hole therein. One end of the pole is connected to the baseplate, and the other end of the pole passes through the second guide hole of the fan and can slide within the first guide hole of the heatsink.

Other systems, methods, features, and advantages of the present cooling apparatus will be or become apparent to one with skill in the art upon examination of the following drawings and detailed description. It is intended that all such additional systems, methods, features, and advantages be included within this description, be within the scope of the present device, and be protected by the accompanying claims.

BRIEF DESCRIPTION OF THE DRAWINGS

Many aspects of the present cooling apparatus can be better understood with reference to the following drawings. The components in the drawings are not necessarily to scale, emphasis instead being placed upon clearly illustrating the principles of the present device. Moreover, in the drawings, like reference numerals designate corresponding parts throughout the several views.

DETAILED DESCRIPTION OF THE INVENTION

Reference will now be made to the drawings to describe a preferred embodiment of the present cooling apparatus and a preferred embodiment of the present testing machine.

Figure 1:
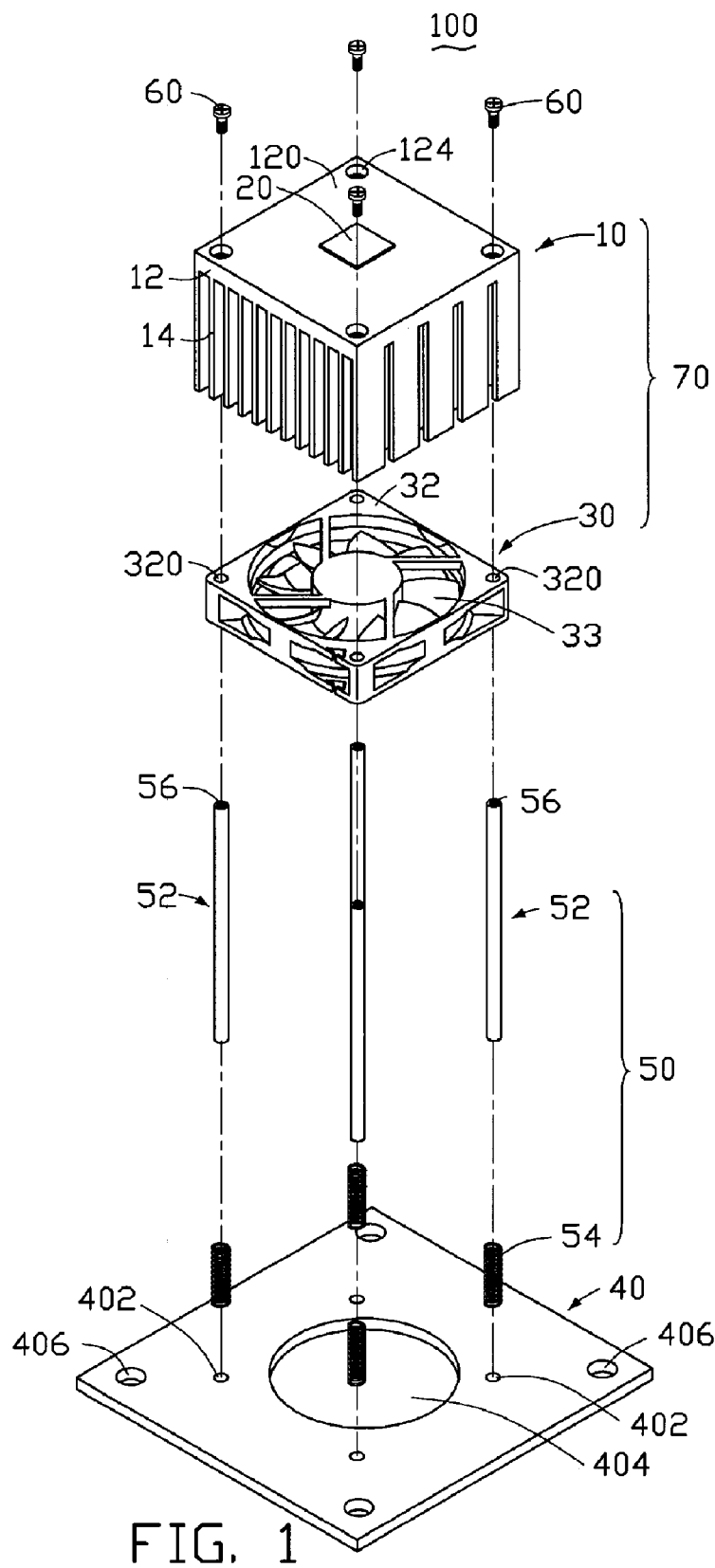
FIG. 1 is an exploded, isometric view of a cooling apparatus in accordance with an exemplary embodiment.

Referring to FIG. 1, a cooling apparatus 100 for cooling a heat-generating member (not shown) includes a cooling device 70 for absorbing and dissipating heat generated by the heat-generating member, a heatsink compound 20, a baseplate 40, a plurality of shock absorbers 50, and a plurality of screws 60. The shock absorbers 50 resiliently support the cooling device 70 on the baseplate 40.

The cooling device 70 includes a heatsink 10, and a fan 30. The heatsink 10 is supported by the fan 30 and is used for absorbing heat. The fan 30 is used for accelerating the airflow through the heatsink, thus increasing the heat dissipating volume.

The heatsink 10 includes a heatsink base 12 and a plurality of heat-dissipating fins 14 extending downwardly from the heatsink base 12. The heatsink base 12 includes a top surface 120 and defines a plurality first guide holes 124 therein. The first guide holes 124 vertically extend through the heatsink base 12.

The heatsink compound 20 is stuck on a center of the top surface 120. The heatsink compound 20 is made of thermal interface material that is used to conduct the heat from the heat-generating member to the cooling device 70.

The fan 30 includes a square bracket 32 holding a propeller 33 of the fan 30. The bracket 32 defines a plurality of second guide holes 320 therein.

The base plate 40 defines a plurality of third guide holes 402, a heat-dissipating hole 404 in a center thereof for providing an outlet for hot air flowing from the heatsink 10, and a plurality of fastening holes 406 in corresponding corners.

Each shock absorber 50 includes a pole 52 and an resilient member 54. Each pole 52 forms a thread hole 56 in a top end (not labeled) thereof. The resilient members 54 can be a rubber gasket, a spring and so forth. The outer diameter of the resilient member 54 is larger than those of the first guide hole 124, the second guide hole 320, and the third guide 402.

Figure 2:
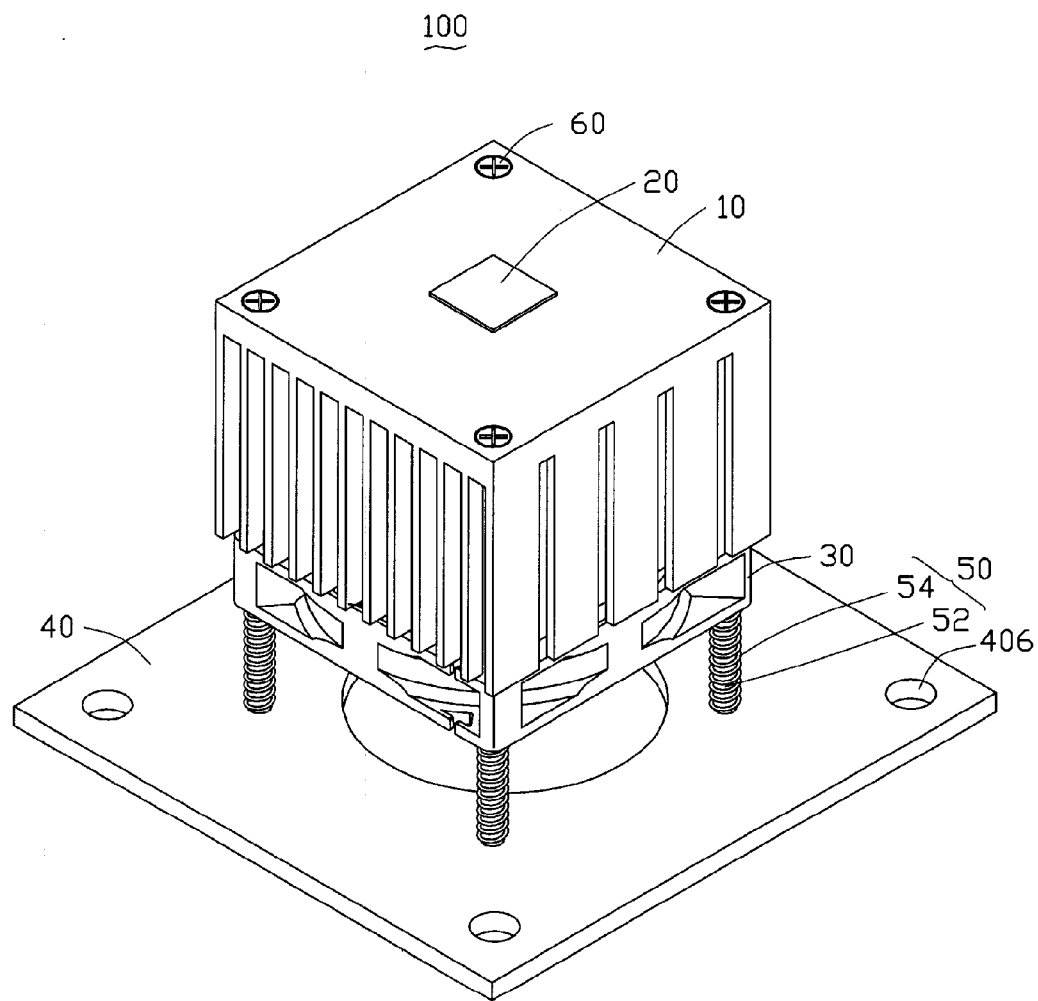
FIG. 2 is an assembled, isometric view of the cooling apparatus of FIG. 1.

Referring to FIG. 2, in assembling of the cooling apparatus 100, the top end of the pole 52 is inserted into the first guide hole 124, screw 60 is also inserted into the first guide hole 124 and screwed into the top end of the pole 52 to engage with the thread hole 56 therein, so that the pole 56 is connected to the heatsink 10. A bottom end (not labeled) of the pole 52 is guided through the second guide hole 320 of the fan 30, the resilient member 54 and the third guide hole 402 of the base plate sequentially. The resilient member 54 is clamped between the second guide hole 320 and the third guide 402. Without any fastener in the bottom end, the pole 52 can move freely in the third guide hole 402. The pole 52 can move up and down relative to the base plate 40.

Figure 6:
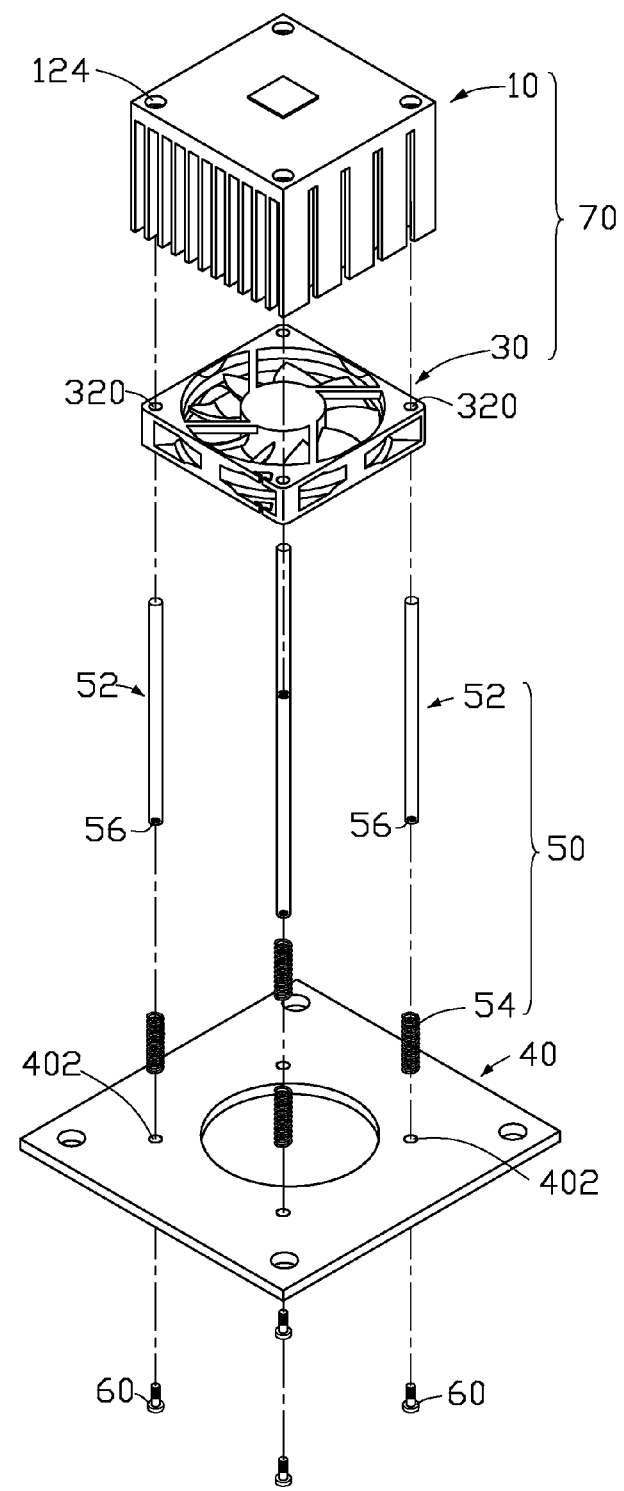
FIG. 6 is an exploded, isometric view of a cooling apparatus in accordance with an alternative embodiment.

In other embodiments, referring to FIG. 6, the thread hole 56 can also be formed in the bottom end of the pole 52, and in assembly, the screw 60 can also be inserted into the third guide hole 402 and screwed into the bottom end of the pole 52 to engage with the thread hole 56. Furthermore, the pole 52 is guided through the resilient member 54, the second guide hole 320 of the fan 30, and the first guide hole 124 of the heatsink 10 continuously. The pole 52 can move up and down relative to the heatsink 10.

Figure 3:
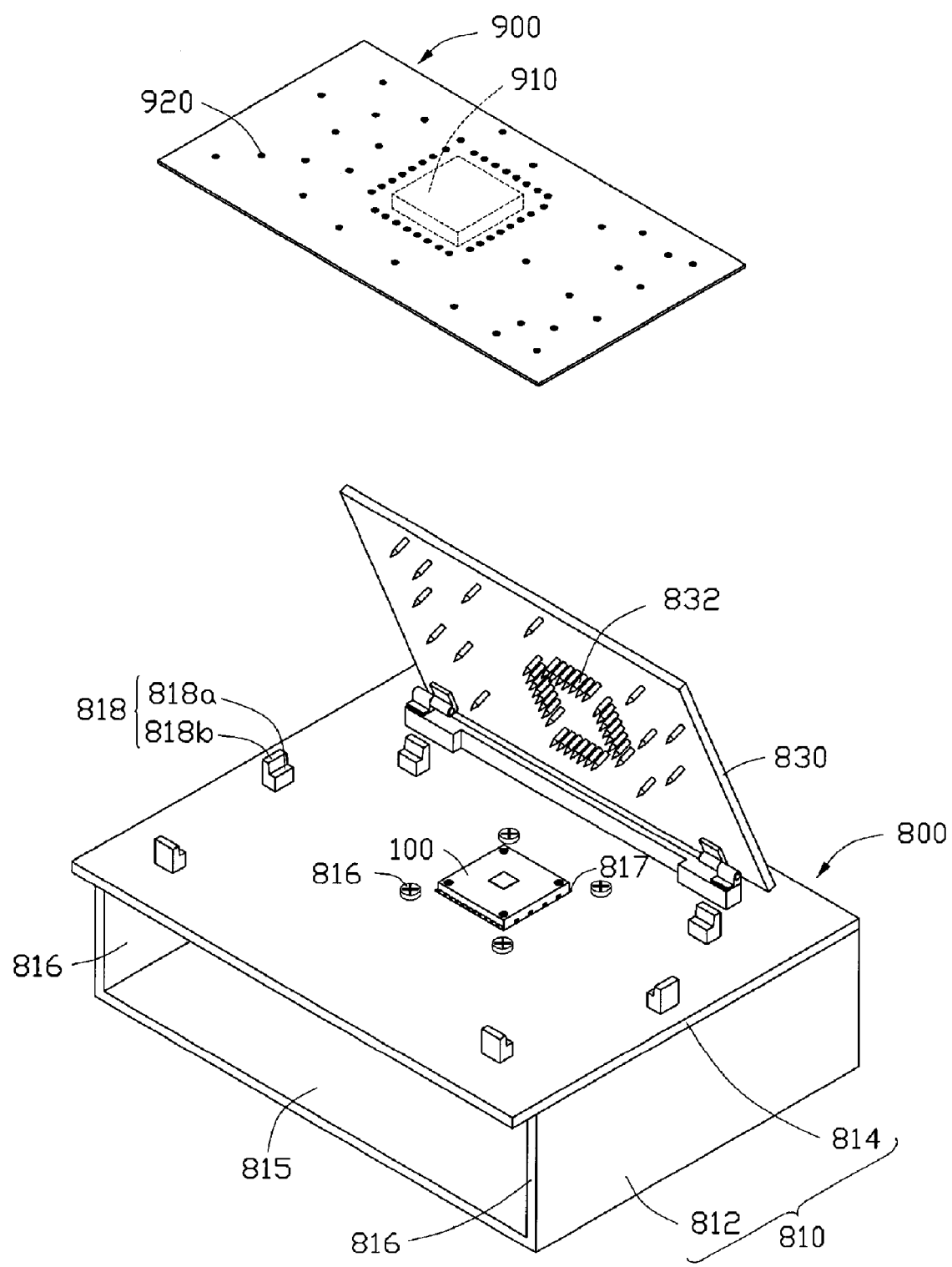
FIG. 3 is an isometric view of a testing machine using the cooling apparatus shown in FIG. 2 with a testing member thereof released, and an electronic product to be tested.
Figure 4:
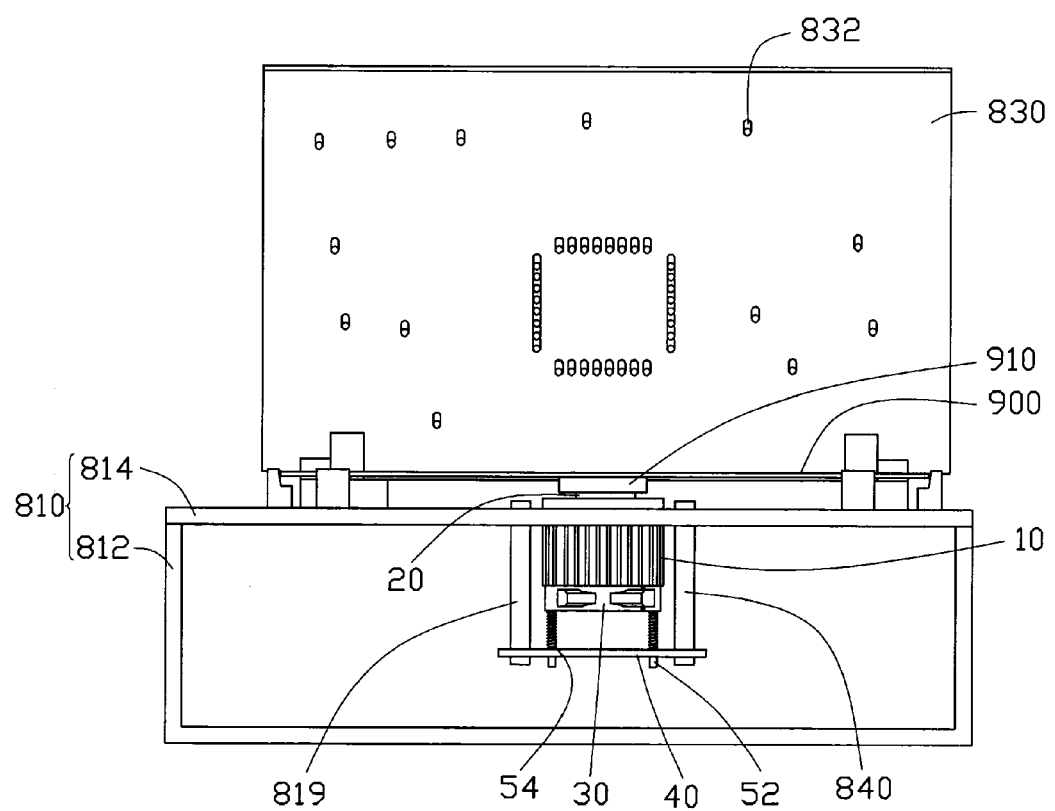
FIG. 4 is a front view of the testing machine of FIG. 3.
Figure 5:
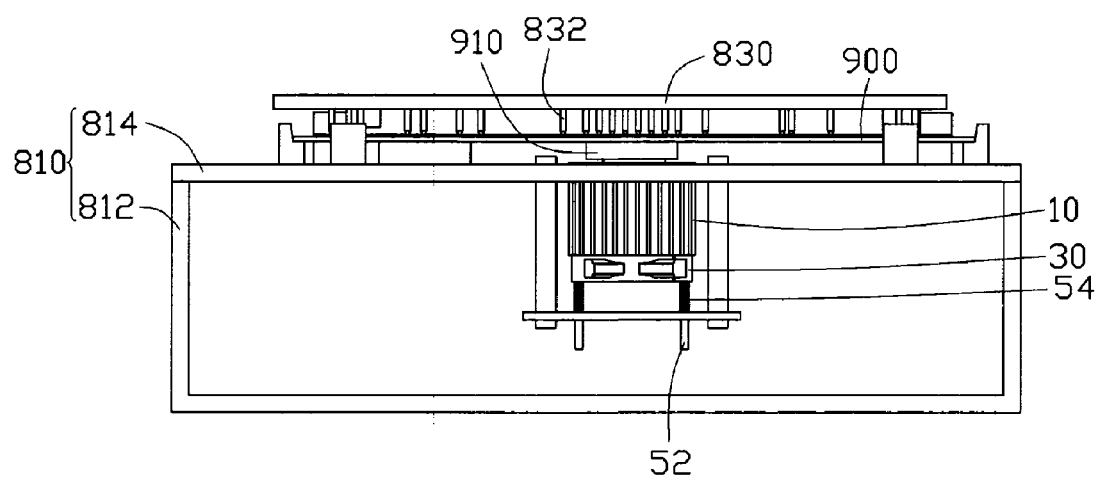
FIG. 5 is a front view of the testing machine and the electronic product of FIG. 3, with the testing member covering on the mainboard.

Referring to FIGS. 3, 4, and 5, a testing machine 800 using the above-described cooling apparatus 100 is illustrated. The testing machine 800 is used to test an electronic product 900. In this embodiment, the electronic product 900 is a mainboard of a personal computer (not shown), which includes a CPU 910, and a plurality of touch points 920 for electrically contacting the testing machine 800. The testing machine 800 includes a carrier 810 for supporting the electronic product 900, a testing member 830 for testing the electronic product 900, and the cooling apparatus 100 being received in the carrier 810 for absorbing and dissipating heat generated by the CPU 910.

The carrier 810 includes a frame 812, a mounting board 814 mounted on the frame 812 for supporting the electronic product 900, a plurality of locating screws 816, and a plurality of connecting shafts 819 (refer to FIG. 4 and FIG. 5). The frame 812 includes a bottom wall 815 and two side walls 816 vertically extending upwards from the bottom wall 815. The mounting board 814 is supported by the side walls 816. The mounting board 814 defines an opening 817 and a plurality of screw holes (not shown) around the opening 817, and forms a plurality of mounting elements 818 on the peripheral zone of the mounting board 814 for supporting the electronic product 900 thereon. In the embodiment, each mounting element 818 includes a base portion 818a for supporting the electronic product 910 on the mounting board 814, and a side portion 818b for restricting a horizontal movement of the electronic product 910. Each connecting shaft 819 defines two thread holes (not shown) in two ends thereof for securing the cooling apparatus 100 to the mounting board 814 by screws.

The testing member 830 has a substantially rectangular shape, and is pivotally connected to the mounting board 814. The testing member 830 forms a plurality of probes 832 for electrically contacting the touch points 920 for testing.

When mounting the cooling apparatus 100 into the carrier 810, the bottom end of each connecting shaft 819 is inserted into one fastening hole 406 and screwed to the baseplate 40. The cooling apparatus 100 is positioned in the frame 812 with a part of the heatsink 10 protruding from the opening 817. Finally, the top end of each connecting shaft 819 is screwed into the mounting board 814 by the locating screw 816. Thus, the cooling apparatus 100 is stably suspended inside the carrier 810. The poles 52 of the cooling apparatus 100 can move up and down freely inside the carrier 810.

During a test operation, the electronic product 900 is set onto the mounting board 814, and is supported by the mounting elements 818, with the CPU 910 in contact with the heatsink compound 20 of the cooling apparatus 100. The testing member 830 is folded and pressed over to cover the electronic product 900 by an outer pressure such that the probes 832 contacting the touch points 920 of the electronic product 900. During testing, heat generated by the CPU 910 of the electronic product 900 is well conducted to the heatsink 10 via the heatsink compound 20, and is dissipated by the airflow generated by the fan 30.

When an excessive force is applied to the cooling apparatus 100 by the electronic product 900, the cooling apparatus 100 excepting the baseplate 40 thereof is moved downwards under the force, with the resilient member 54 compressed. This downward movement can soften and dampen a potential impact between the CPU 910 and the cooling apparatus 100 to avoid damaging the CPU 910.

It should be emphasized that the above-described preferred embodiment, is merely a possible example of implementation of the principles of the invention, and is merely set forth for a clear understanding of the principles of the invention. Many variations and modifications may be made to the above-described embodiment of the invention without departing substantially from the spirit and principles of the invention. All such modifications and variations are intended to be included herein within the scope of this disclosure and the present invention and be protected by the following claims.

What is claimed is:

1. A cooling apparatus comprising:
   a cooling device for absorbing and dissipating heat;
   a baseplate; and
   at least one resilient shock absorber;
   wherein the resilient shock absorber comprises a pole and a resilient member, the pole passes through the resilient member, the resilient member is clamped between the cooling device and the baseplate; the cooling device comprises a heatsink, and a fan such that the heatsink is supported by the fan; the heatsink defines a first guide hole therein, the fan defines a second guide hole therein; one end of the pole is connected to the baseplate, and the other end of the pole passes through the second guide hole of the fan and can slide within the first guide hole of the heatsink.

2. The cooling apparatus according to claim 1, wherein the baseplate defines a third guide hole therein, an end of the pole is connected to the cooling device, and another end of the pole is slidably passed through the third guide hole of the baseplate.

3. The cooling apparatus according to claim 1, wherein the cooling device defines at least one guide hole therein, an end of the pole is connected to the baseplate, and another end of the pole can slide in the guide hole of the cooling device.

4. A testing machine for testing an electronic product, the testing machine comprising:
   a carrier for supporting the electronic product;
   a cooling apparatus being received in the carrier, and the cooling apparatus comprising:
   a cooling device for contacting the electronic product to absorb and dissipate heat;
   a baseplate being connected to the carrier; and
   at least one shock absorber resiliently supporting the cooling device on the baseplate;
   wherein the shock absorber comprises a pole and a resilient member, the pole passes through the resilient member, the resilient member is clamped between the cooling device and the baseplate; the cooling device comprises a heatsink, and a fan supporting the heatsink; the heatsink defines a first guide hole therein, the fan defines a second guide hole therein; one end of the pole is fixed to the baseplate, and the other end of the pole passes through the second guide hole of the fan and can slide within the first guide hole of the heatsink.

5. The testing machine according to claim 4, wherein the carrier comprises a frame, a mounting board being on the frame, and at least one connecting shaft, wherein the cooling apparatus is received in the frame, and one end of the connecting shaft is connected to the mounting board while the other end of the connecting shaft is connected to the baseplate.

6. The testing machine according to claim 5, wherein the mounting board defines an opening therein, and a part of the cooling device protrudes from the opening.

7. A testing machine for testing an electronic product, the testing machine comprising:
   a carrier supporting the electronic product;
   a testing member configured for covering the electronic product;
   a cooling apparatus being received in the carrier, and the cooling apparatus comprising:
   a cooling device for contacting the electronic product to absorb and dissipate heat;
   a baseplate being connected to the carrier; and
   at least one shock absorber resiliently supporting the cooling device on the baseplate;
   wherein the shock absorber comprises a pole and a resilient member, the pole passes through the resilient member, the resilient member is clamped between the cooling device and the baseplate; the cooling device comprises a heatsink, and a fan such that the heatsink is supported by the fan; the heatsink defines a first guide hole therein, the fan defines a second guide hole therein; an end of the pole is connected to the baseplate, and another end of the pole passes through the second guide hole of the fan and can slide within the first guide hole of the heatsink.

8. The testing machine according to claim 7, wherein the carrier comprises a frame, a mounting board being on the frame, and at least one connecting shaft, wherein the cooling apparatus is received in the frame, and one end of the connecting shaft is connected to the mounting board while the other end of the connecting shaft is connected to the baseplate.

9. The testing machine according to claim 8, wherein the mounting board defines an opening therein, and a part of the cooling device protrudes from the opening.

* * * * *